United States Patent
Bradley

(10) Patent No.: US 6,417,703 B1
(45) Date of Patent: Jul. 9, 2002

(54) FREQUENCY SYNTHESIZER USING A RATIO SUM TOPOLOGY

(75) Inventor: Donald A. Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 08/719,763

(22) Filed: Sep. 25, 1996

(51) Int. Cl.[7] ................................................. H04K 1/00
(52) U.S. Cl. ......................... 327/105; 327/113; 455/76
(58) Field of Search ................................ 327/105, 107, 327/147, 156, 113, 115, 355; 455/76, 77, 118

(56) References Cited

U.S. PATENT DOCUMENTS 5,140,284 A * 8/1992 Petersson et al. ............. 331/25
5,301,366 A * 4/1994 Groshong et al. ............ 455/76
5,353,311 A * 10/1994 Hirata et al. ................ 327/156

* cited by examiner

*Primary Examiner*—Dinh T. Le
(74) *Attorney, Agent, or Firm*—Fliesler, Dubb, Meyer & Lovejoy, LLP

(57) ABSTRACT

A frequency synthesizer including a divide by R frequency divider providing a first input of a phase detector, a divide by N frequency divider providing a second input of the phase detector, and a voltage control oscillator (VCO) receiving the output of the phase detector and providing an input to the divide by N frequency divider, the VCO output signal being transitioned by varying the frequency division number R. The frequency division number N may also be varied to transition the VCO output signal frequency. A reference oscillator provides an input to the variable R frequency divider and may have its frequency varied to limit resolution error. For greater resolution, multiple frequency synthesizers with divide by R and N frequency dividers having variable frequency division numbers may be connected using mixers to provide a "ratio sum" synthesizer having an output frequency proportional to a sum of N/R ratios.

11 Claims, 10 Drawing Sheets

FREQUENCY SYNTHESIZER USING A RATIO SUM TOPOLOGY

BACKGROUND OF THE INVENTION

1. Field of the Invention

The present invention relates to frequency synthesizers. More particularly, the present invention relates to synthesizers configured to provide a high frequency output, such as from 600–1200 MHz, while supporting a high output resolution, such as 0.1 Hz, and a low settling time, such as 72 μsec or less.

2. Description of the Related Art

I. FIXED R SYNTHESIZER

FIG. 1 shows traditional components for a "fixed R" frequency synthesizer used as a component in a synthesizer operating from 600–1200 MHz and providing a 0.1 Hz resolution with a 72 μsec settling time. As shown, the fixed R frequency synthesizer of FIG. 1 includes a reference oscillator 100 providing a signal having a frequency $F_R$. A frequency divider 102 divides the output from reference oscillator 100 by a fixed amount R to provide a first input to a phase detector 104. A voltage controlled oscillator (VCO) 106 provides the synthesizer output having a frequency Fo. A frequency divider 108 divides the frequency Fo of the VCO 106 by N to provide a second input to phase detector 104. The output of the phase detector 104 is provided through an integrator 110 to the voltage control input of VCO 106.

In operation, the value for R remains fixed, while N is incrementally changed to control the frequency Fo. The frequency (Fp) of signals provided at inputs of phase detector 104 remain constant. Thus, $Fp = F_R/R = Fo/N$, and Fo is obtained as $Fo = F_R N/R$. Resolution (RES) is then obtained by taking the difference in frequencies of the output signal Fo as N in frequency divider 108 is incrementally changed or $RES = F_R(N+1)/R - F_R N/R = F_R/R$. Settling time ($t_{settle}$) is determined in terms of the frequency Fp of signals provided to phase detector 104 as follows: $t_{settle} = 4.5/(2\pi(Fp/10))$.

Table A shows values for Fo, N and R in the circuit of FIG. 1 with $F_R = 10$ MHz, a resolution of 1 KHz and a desired $Fo = 10.245$ MHz±10 KHz. Note with $RES = F_R/R$, R is 10,000. Further, $Fp = F_R/R = 1$ KHz making $t_{settle} = 4.5/(2\pi(Fp/10)) = 7.2$ msec.

TABLE A

| Fo MHz | N | R |
| --- | --- | --- |
| 10.235 | 10235 | 10000 |
| 10.236 | 10236 | 10000 |
| 10.237 | 10237 | 10000 |
| 10.238 | 10238 | 10000 |
| 10.239 | 10239 | 10000 |
| 10.240 | 10240 | 10000 |
| 10.241 | 10241 | 10000 |
| 10.242 | 10242 | 10000 |
| 10.243 | 10243 | 10000 |
| 10.244 | 10244 | 10000 |
| 10.245 | 10245 | 10000 |
| 10.246 | 10246 | 10000 |
| 10.247 | 10247 | 10000 |
| 10.248 | 10248 | 10000 |
| 10.249 | 10249 | 10000 |
| 10.250 | 10250 | 10000 |
| 10.251 | 10251 | 10000 |
| 10.252 | 10252 | 10000 |
| 10.253 | 10253 | 10000 |
| 10.254 | 10254 | 10000 |
| 10.255 | 10255 | 10000 |

Utilizing the circuit of FIG. 1 with a higher frequency output signal Fo, such as 600 MHz, to obtain a high resolution the settling time will be very large. For instance, if a desired $RES = Fp = 1$ Hz, settling time $t_{settle}$ will be 7 seconds.

II. DIVIDE SUM SYNTHESIZER

To obtain a smaller settling time while maintaining a high resolution, a plurality of the fixed R synthesizers as shown in FIG. 1 can be combined to form a "divide sum" synthesizer as shown in FIGS. 2A and 2B. FIG. 2A shows a fine resolution portion of a divide sum synthesizer, while FIG. 2B shows a coarse resolution portion of the divide sum synthesizer. The divide sum synthesizer of FIGS. 2A–2B can support a 600–1200 MHz output while providing a 0.1 Hz resolution and 72 μsec settling time.

The fine resolution portion of the divide sum synthesizer shown in FIG. 2A includes fixed R synthesizers 201–203. The fixed R synthesizers 201–203 utilize a common reference oscillator 205 providing a signal having a frequency $F_R$. The common reference oscillator 205, such as a 10 MHz source shown, can be provided from a standard external signal source enabling the output of the divide sum synthesizer to be synchronized, or coherent with the common reference output $F_R$.

The output of the fixed R synthesizer 201 (F2) is provided to a first input of a mixer 206, while a second input of the mixer 206 is provided from an output (F1) of a VCO 208. The output of VCO 208 is further provided through a frequency divider 210 which provides the output ($F_A$) for the circuitry of FIG. 2A. The frequency divider 210 divides the output of VCO 208 by a fixed number, shown here as 1000. The output of mixer 206 provides a signal (F3) through band pass filter (B.P.F.) 212 having a frequency equal to the difference in the signals F1 and F2 to an input of additional mixer 214.

The output of the fixed R synthesizer 202 is provided through a frequency divider 216 to provide a signal (F4) to a second input of mixer 214. Frequency divider 216 divides the output of fixed R synthesizer 216 by a fixed number, shown here as 5. The output of mixer 214 provides a signal (F5) through band pass filter 218 having a frequency equal to the difference in the signals F3 and F4 to an input of a phase detector 220.

The output of the fixed R synthesizer 203 is provided through a frequency divider 222 to provide a signal (F6) to a second input of phase detector 220. Frequency divider 222 divides the output of fixed R synthesizer by a fixed number, shown here as 100. The output of the phase detector 220 is then coupled through an integrator 224 to the voltage control input of VCO 208.

Because the output frequency of VCO 208 is divided down through two mixers 206 and 214 before being provided to phase detector 220, a significant variation in the initial frequency of VCO 208 from a predicted value used to set the output frequencies of fixed R synthesizers 201–203 may prevent the circuitry of FIG. 2A from locking the output frequency of VCO 208. To presteer the output frequency of VCO 208 to a desired initial frequency, and assure lock, a user controlled D/A converter 226 is provided. The D/A converter 226 has its output connected through summer 228 along with the output of integrator 224 to provide the voltage control input to VCO 208.

In operation, the output frequency of each of the fixed R synthesizers 201–203 can be determined utilizing the equations provided with respect to FIG. 1 as follows:

$$F2=F_R N1/R1$$

$$F4=F_R N2/(5R2)$$

$$F6=F_R N3/(100R3)$$

Using the equations for F2 and F4, the frequencies of signals output from mixers 206 and 214 can be determined as follows:

$$F3=F2-F1=F_R N1/R1-F1$$

$$F5=F3-F4=F_R(N1/R1-N2/(5R2))-F1$$

With the phase detector 220 assuring that the signals F5 and F6 are equal, the frequency of signal F1 can be derived from the above equations for F5 and F6 as follows:

$$F1 = F_R(N1/R1 - N2(5R2)) - F_R N3/(100R3)$$

$$= F_R(N1/R1 - N2(5R2) - N3/(100R3))$$

Assuming that the values for R1, R2 and R3 are respectively 5, 50 and 100, and utilizing the fact that $F_A=F1/10000$, the frequency $F_A$ can be derived as follows:

$$F_A=200N1-4N2-N3/10.$$

With values for R1, R2, R3, and $F_R$ chosen as shown in FIG. 2A, values for N1, N2 and N3 are shown in FIG. 2A selected to provide an output signal $F_A$ ranging from 100–200 KHz. For the values for N1, N2 and N3 shown, frequencies at the outputs of the oscillators and inputs to phase detectors are also shown.

With the value for N1 being variable while N2 and N3 remain fixed, as shown in FIG. 2A, output resolution for the circuit of FIG. 2A, taking into account frequency divider 210, is calculated as RES=$F_R$/(10000R1)=200 Hz. Alternatively, with N2 being variable, while N1 and N3 remain fixed, taking into account frequency divider 216, output resolution will be RES=$F_R$/(50000R2)=4 Hz. To provide an even greater resolution N3 can be varied while N1 and N2 remain fixed, making the output resolution RES=$F_R$/(100000R3)=0.1 Hz. Thus, by properly controlling N1, N2 and N3, the fine resolution synthesizer circuit of FIG. 2A can provide a 100–200 KHz output with as high as a 0.1 Hz resolution. Further, with the frequency output of the N3 frequency divider being 100 KHz=Fp, and N3 being altered to control $F_A$, $t_{settle}$=4.5/(2π(Fp/10))=72 µsec.

FIG. 2B shows a coarse resolution portion of the divide sum synthesizer which includes a fixed R synthesizer 204. The fixed R synthesizer 204, similar to synthesizers 201–203 of FIG. 2A, utilizes the common reference oscillator 205 to enable synchronization with a standard external source.

The output of the fixed. R synthesizer 204 (F8) is provided to the first input of a mixer 230, while a second input of mixer 230 is provided from an output (F7) of a VCO 232. The output of VCO 232 further provides the output of the circuit of FIG. 2B. The output of mixer 230 provides a signal (F9) through band pass filter 234 having a frequency equal to the difference in the signals F7 and F8 to an input of a phase detector 236.

A phase detector 238 receives a first input from the output $F_A$ of frequency divider 210 of FIG. 2B. A second input (F11) of the phase detector 238 is provided from a mixer 240 through bandpass filter 242. A first input of mixer 240 is provided from the reference oscillator 205. A second input (F10) of mixer 240 is provided as the output from VCO 244 which has its input coupled to the output of phase detector 238. The signal F10 from the output of oscillator 244 is further provided as a second input to phase detector 236. The output of phase detector 236 is then provided through integrator 246 to the voltage control input of oscillator 232.

As with oscillator 208 in FIG. 2A, oscillator 232 receives presteering from a user controlled D/A converter 248. Presteering assures that the output frequency of oscillator 232 can be locked using the circuitry of FIGS. 2A and 2B. To provide the presteering, the D/A converter 248 output is connected along with the output of integrator 246 to a summer 250. The output of summer 250, then provides the voltage control input to VCO 208.

In operation, the output frequency of the fixed R synthesizer 204 can be determined by the following equation:

$$F8=F_R N4/R4$$

Further, using the equation for F8, the output frequency of the signal from mixer 230 can be determined as follows:

$$F9=F8-F7=F_R N4/R4-F7$$

Further, with the mixer 240 assuring F11=F10-$F_R$ and phase detector 238 assuring $F_A$=F11, F10 can be derived as follows:

$$F10=F_A+F_R$$

With phase detector 236 assuring F9=F10, from the equations for F9 and F10 above, we can derive F7 as follows:

$$F7 = F_R N4/R4 - F_A - F_R$$

$$= F_R(N4/R4 - 1) - F_A$$

Substituting the equation for $F_A$ derived with respect to FIG. 2A, F7 is further defined as follows:

$$F7=F_R(N4/R4-N1/(1000R1)-N2/(50000R2)-N3/((10000000R3)-1)$$

Note from this equation for F7 it can be seen how the term "divide sum" used to describe the synthesizers of FIGS. 2A–2B is derived as the "sum" of the "divided" N/R ratios.

Assuming the value for R4 is 100 and the values for components of FIG. 2A are chosen as shown, F7 is further defined as follows:

$$F7=100,000N4-200N1+4N2+N3/10-10 \text{ MHz}$$

With a values for R4 and components in FIG. 2A chosen as shown, values for N4 are shown selected to provide an output signal F7 ranging from 600–1200 MHz.

With the value for N4 being variable while N1–N3 remain fixed, output resolution for the signal F7 can be calculated as RES=$F_R$/R4=100 KHz. Alternatively, with N4 remaining fixed, while N1, N2 or N3 are varied, output resolution will remain as described with respect to FIG. 2A. For instance, with N3 being variable while N1 and N2 remain fixed, output resolution RES=$F_R$/(1000000R3)=0.1 Hz.

Thus, by properly controlling N1–N4, the output F7 can range from 600–1200 MHz with a 0.1 Hz resolution. Further, with the frequency output of the N3 frequency divider being 100 KHz and N3 being altered to control F7, settling time, $t_{settle}=4.5/(2\pi(Fp/10))=72$ μsec.

SUMMARY OF THE INVENTION

The present invention enables significantly less components to be utilized than in a ratio sum topology synthesizer to provide a synthesizer with a 600–1200 MHz range while maintaining a 0.1 Hz resolution and a settling time below 72 μsec.

The present invention further does not require use of a fixed frequency reference oscillator as do synthesizers discussed above.

The present invention includes a "variable R" synthesizer, as opposed to a "fixed R" synthesizer discussed above. The variable R synthesizer includes components similar to FIG. 1, but with the fixed R frequency divider replaced by a variable R frequency divider to enable increased control of output resolution.

In one embodiment of the present invention, the value for N may also be varied along with R to provide greater resolution. The values for N and R may be changed either incrementally in steps of one, or non-incrementally using an iterative process.

With the value for R varied to provide a desired output resolution, error will occur from the desired resolution. To reduce error in resolution, an embodiment of the present invention provides for varying the frequency of a reference oscillator, such as oscillator 100 of FIG. 1.

To provide even greater resolution, a further embodiment of the present invention utilizes multiple variable R synthesizers connected with the VCO output of one of the variable R synthesizers forming the input of a divide by R frequency divider in a subsequent variable R synthesizer.

In an additional embodiment of the present invention, multiple variable R synthesizers may be used to a provide "ratio sum" synthesizer, the ratio sum synthesizer having an output frequency proportional to a sum of N/R ratios of their variable R synthesizers.

In one embodiment of a ratio sum synthesizer, outputs of VCOs from two variable R synthesizers are provided to inputs of a mixer. The output of the mixer is then provided as an input to one of the divide by N frequency dividers, one mixer input then providing the output of the ratio sum synthesizer.

In another embodiment of a ratio sum synthesizer, an output of a first variable R synthesizer is provided with an output of an output signal VCO to inputs of a first mixer, the output of the first mixer is then provided with the output of a second variable R synthesizer to inputs of a second mixer, the output of the second mixer is then provided with the output of a third variable R synthesizer to inputs of a phase detector, and the output of the phase detector is used to control the output signal VCO.

BRIEF DESCRIPTION OF THE DRAWINGS

Further details of the present invention are explained with the help of the attached drawings in which.

DETAILED DESCRIPTION

I. VARIABLE R SYNTHESIZER

Figure 2A:
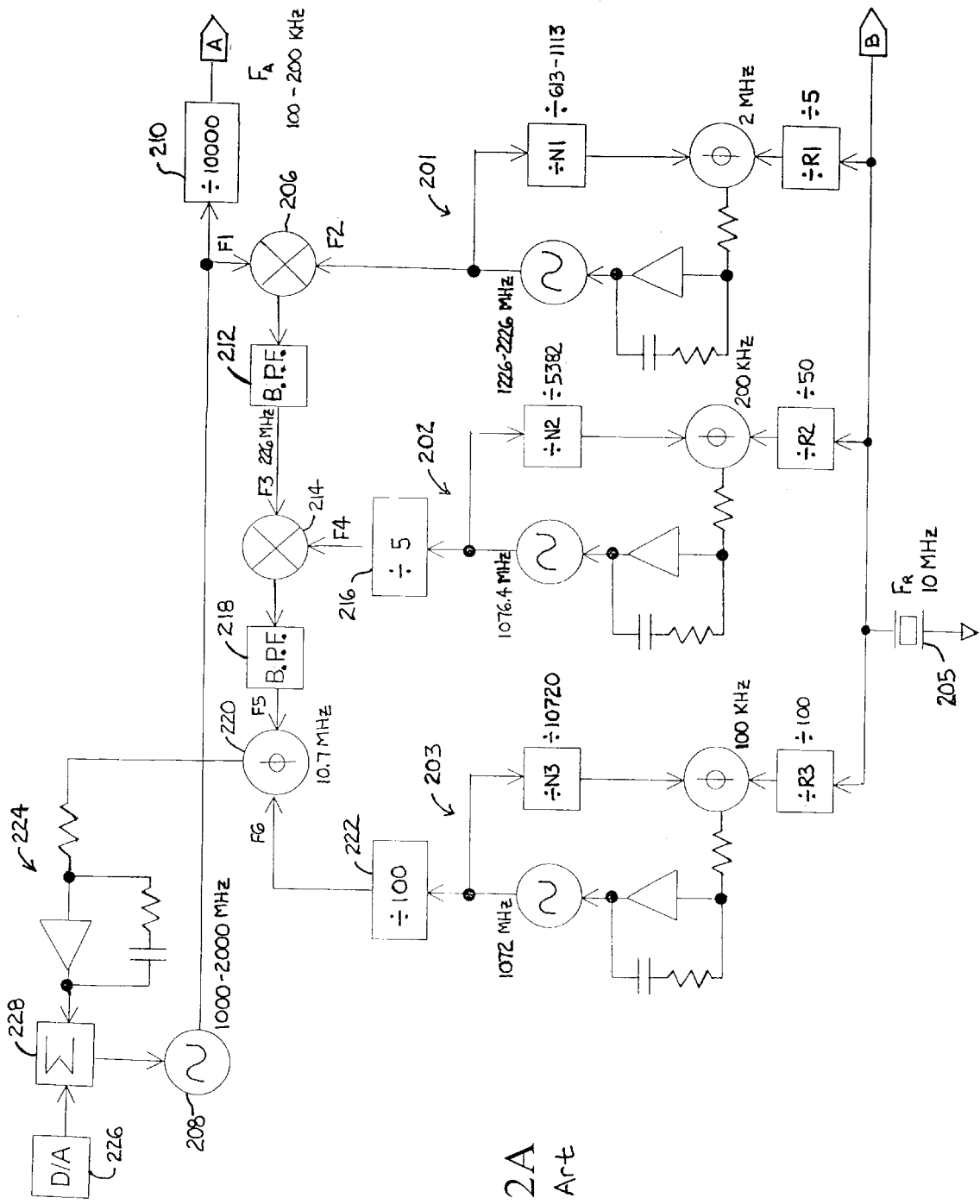
FIG. 2A shows a fine resolution portion of a divide sum synthesizer.
Figure 2B:
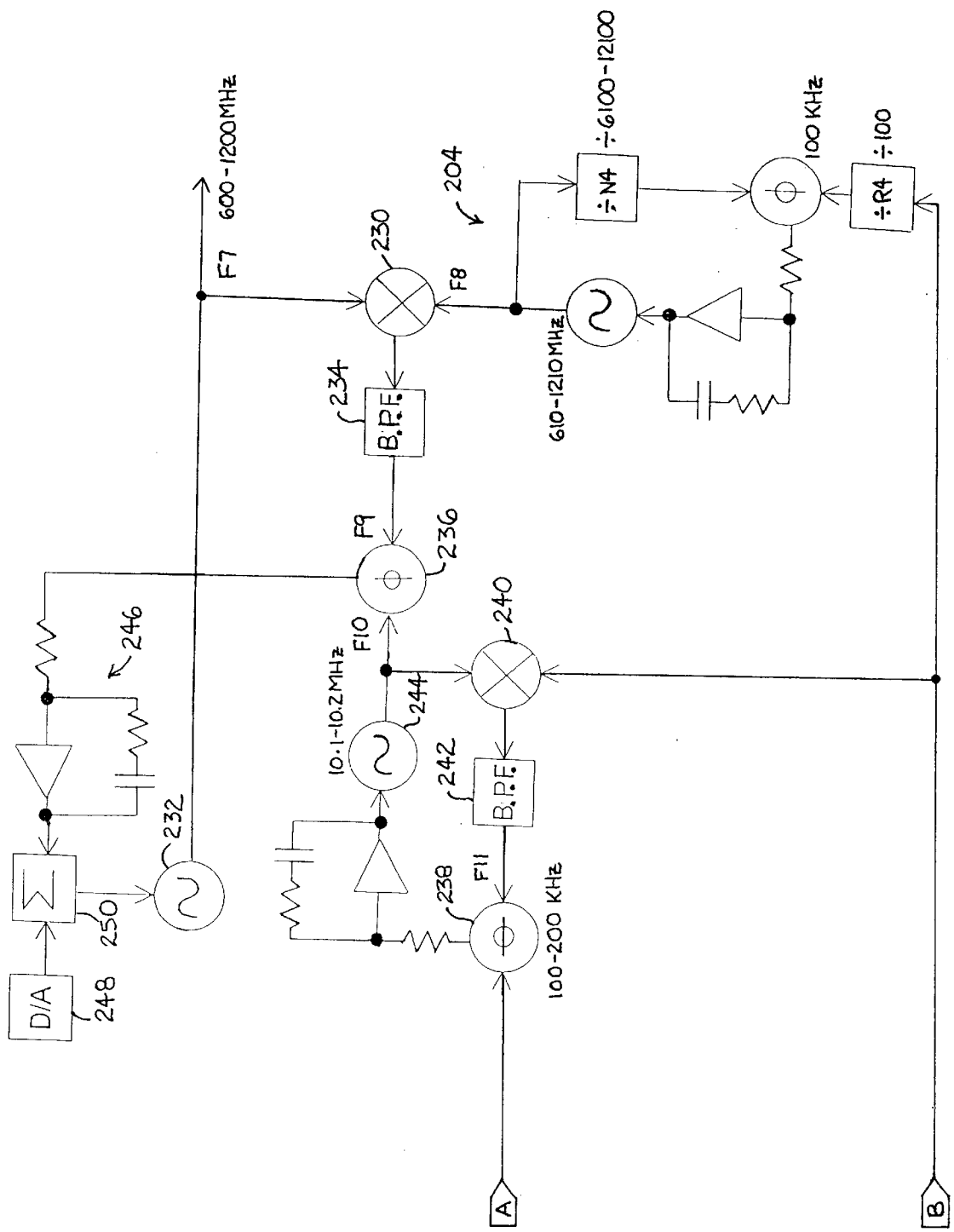
FIG. 2B shows a coarse resolution portion of the divide sum synthesizer.
Figure 3:
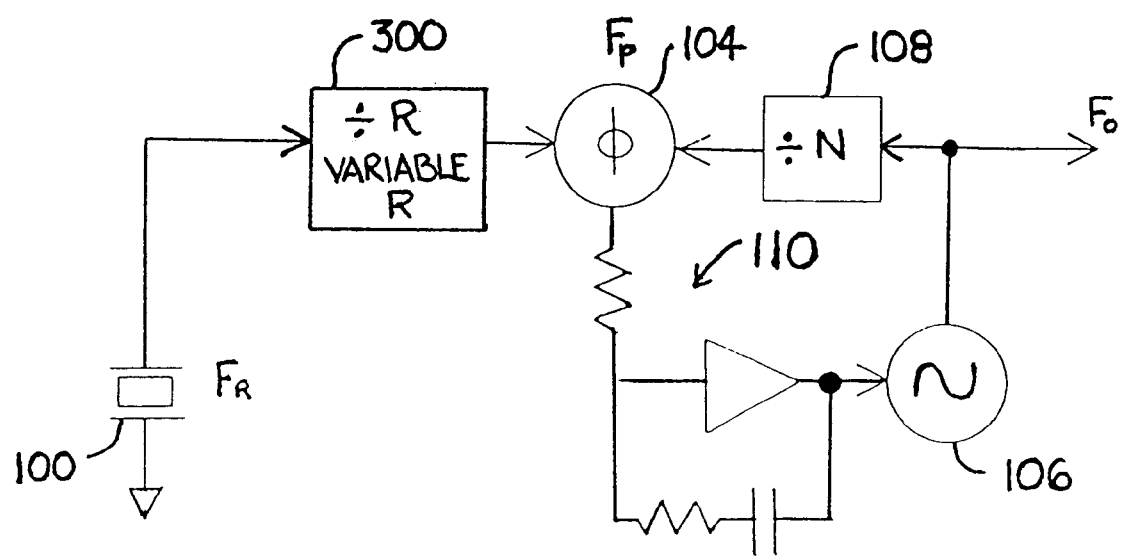
FIG. 3 shows components for a variable R frequency synthesizer.

The present invention includes a "variable R" frequency divider as shown in FIG. 3. The circuit of FIG. 3 modifies the components of FIG. 1 by replacing the fixed R frequency divider 102 of FIG. 1 by a variable R frequency divider 300. For convenience, components carried over from FIG. 1 to FIG. 3 are similarly labeled.

Figure 1:
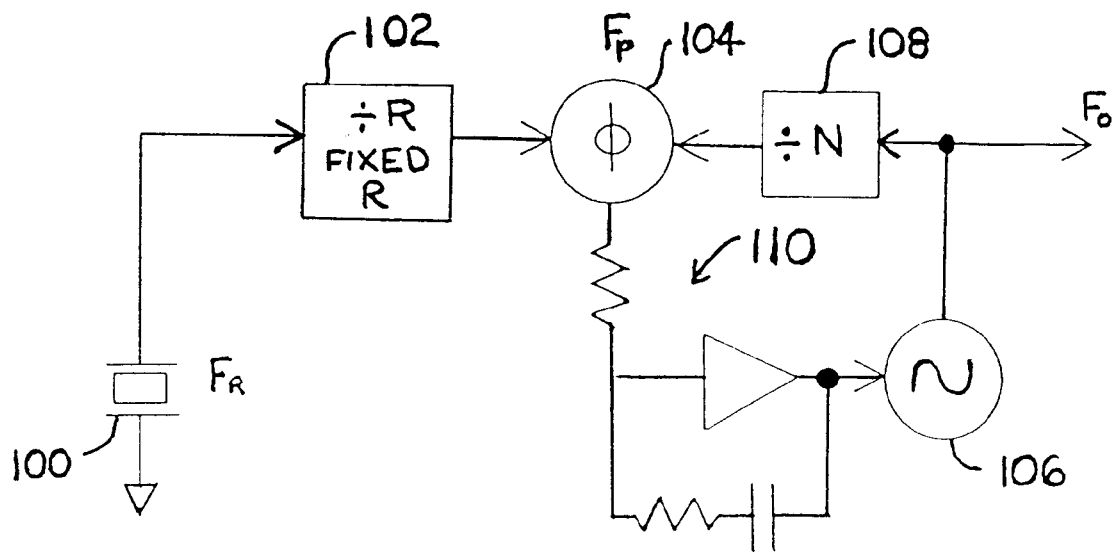
FIG. 1 shows components for a fixed R frequency synthesizer.

As described with respect to FIG. 1, in FIG. 3 the value for Fo=$F_R$N/R. However, with R being variable, unlike with a fixed R synthesizer, resolution can be defined as follows:

$$RES = F_R(N-1)/(R-1) - F_R N/R$$

$$= F_R(N-R)/(R(R-1))$$

With RES=$F_R$/R and R being fixed in previous fixed R synthesizers, no error will occur in providing a set RES value as Fo is changed. However, with a variable R device having RES calculated as shown above, a constant RES value is not maintained with changing Fo without error.

Table A shows values for desired Fo, actual Fo, R, N and error in Fo for a variable R synthesizer. Similar to the fixed R synthesizer with parameters of Table A, resolution is chosen as 1 KHz, Fo=10.245 MHz±10 KHz, and $F_R$=10 MHz.

TABLE B

| Fo MHz | Fo MHz (Actual) | R | N | Error Hz |
|---|---|---|---|---|
| 10.235 | 10.235294 | 255 | 261 | +294 |
| 10.236 | 10.236220 | 254 | 260 | +220 |
| 10.237 | 10.237154 | 253 | 259 | +154 |
| 10.238 | 10.238095 | 252 | 258 | +95 |
| 10.239 | 10.239044 | 251 | 257 | +44 |
| 10.240 | 10.224000 | 250 | 256 | 0 |
| 10.241 | 10.240964 | 249 | 255 | −36 |
| 10.242 | 10.241935 | 248 | 254 | −65 |
| 10.243 | 10.242915 | 247 | 253 | −85 |
| 10.244 | 10.243902 | 246 | 252 | −98 |
| 10.245 | 10.244898 | 245 | 251 | −102 |
| 10.246 | 10.245902 | 244 | 250 | −98 |
| 10.247 | 10.246914 | 243 | 249 | −86 |
| 10.248 | 10.247934 | 242 | 248 | −66 |
| 10.249 | 10.248963 | 241 | 247 | −37 |
| 10.250 | 10.250000 | 240 | 246 | 0 |
| 10.251 | 10.251046 | 239 | 245 | +46 |
| 10.252 | 10.252101 | 238 | 244 | +101 |
| 10.253 | 10.253165 | 237 | 243 | +165 |
| 10.254 | 10.254237 | 236 | 242 | +237 |
| 10.255 | 10.255319 | 235 | 241 | +319 |

In Table B with R=N−6, and R ranging from 255 to 235, Fp=$F_R$/R or approximately 40 KHz. With Fp being 40 KHz, settling time $t_{settle}=4.5/(2\pi(Fp/10))\approx180$ μsec. As can be seen, a 180 μsec settling time of the variable R synthesizer is significantly less than the 7.2 msec settling time of the fixed R synthesizer of Table A with a similar Fo range and resolution.

II. VARIABLE R SYNTHESIZER WITH N FIXED

For a variable R synthesizer, both N and R can be varied as shown in Table B, or R can be varied with N remaining constant as shown in Table C below. With R being variable and N constant, resolution is defined as follows:

$$RES = F_R/(R-1) - F_R N/R$$
$$= F_R N/(R(R-1))$$

As when both N and R are varied, with only R varied a constant RES value is not maintained with changing Fo without error.

Table C shows values for desired Fo, actual Fo, R, N and error in Fo for a variable R synthesizer with N remaining constant. Similar to Table A and Table B, in Table C, parameters are given for a desired resolution of 1 KHz and Fo=10.245 MHz±10 KHz. Unlike for Table A and Table B, $F_R$ is set to a high value of 1 GHz to maintain a settling time as short as possible.

TABLE C

| Fo MHz | Fo MHz (Actual) | R | N | Error (Hz) |
|---|---|---|---|---|
| 10.235 | 10.234798 | 9966 | 102 | −202 |
| 10.236 | 10.235825 | 9965 | 102 | −175 |
| 10.237 | 10.236853 | 9964 | 102 | −147 |
| 10.238 | 10.237880 | 9963 | 102 | −120 |
| 10.239 | 10.238908 | 9962 | 102 | −92 |
| 10.240 | 10.239936 | 9961 | 102 | −64 |
| 10.241 | 10.240964 | 9960 | 102 | −36 |
| 10.242 | 10.241992 | 9959 | 102 | −8 |
| 10.243 | 10.243021 | 9958 | 102 | 21 |
| 10.244 | 10.244049 | 9957 | 102 | 49 |
| 10.245 | 10.245078 | 9956 | 102 | 78 |
| 10.246 | 10.246107 | 9955 | 102 | 107 |
| 10.247 | 10.247137 | 9954 | 102 | 137 |
| 10.248 | 10.248166 | 9953 | 102 | 166 |
| 10.249 | 10.249196 | 9952 | 102 | 196 |
| 10.250 | 10.250226 | 9951 | 102 | 226 |
| 10.251 | 10.251256 | 9950 | 102 | 256 |
| 10.252 | 10.252287 | 9949 | 102 | 287 |
| 10.253 | 10.253317 | 9948 | 102 | 317 |
| 10.254 | 10.254348 | 9947 | 102 | 348 |
| 10.255 | 10.255379 | 9946 | 102 | 379 |

With R ranging from 9946 to 9966, Fp is approximately 100 KHz, making $t_{settle}$ approximately 72 μsec. As can be seen, a 72 μsec settling time is significantly less than the 7.2 msec settling time of the fixed R synthesizer of Table A with a similar Fo range and resolution.

III. VARIABLE R SYNTHESIZER WITH R,N CHOSEN ITERATIVELY

Instead of incrementally varying R and N, R and N may be chosen utilizing an iterative process. Table D below shows values for desired Fo, R, N and error in Fo for a variable R synthesizer with R and N chosen utilizing an iterative process. Similar to Table C, parameters are given for Fo=10.245 MHz±10 KHz, and $F_R$=1 GHz. In contrast to Table C, R ranges from 102 to 105 to maintain a settling time well below the 72 μsec settling time of Table C. Further in contrast to Table C, error in Fo is lowered to less than 100 Hz.

TABLE D

| Fo MHz | R | N | Error (Hz) |
|---|---|---|---|
| 10.235 | 105 | 10259 | −84.3 |
| 10.236 | 105 | 10258 | −86.6 |
| 10.237 | 105 | 10257 | −88.6 |
| 10.238 | 105 | 10256 | −90.5 |
| 10.239 | 102 | 9962 | −92.2 |
| 10.240 | 102 | 9961 | −64.3 |
| 10.241 | 102 | 9960 | −36.1 |
| 10.242 | 102 | 9959 | −7.8 |
| 10.243 | 102 | 9958 | +20.7 |
| 10.244 | 102 | 9957 | +40.4 |
| 10.245 | 102 | 9956 | +78.3 |
| 10.246 | 100 | 9760 | −98.4 |
| 10.247 | 100 | 9759 | −48.5 |
| 10.248 | 100 | 9758 | +1.6 |
| 10.249 | 100 | 9757 | +52.0 |
| 10.250 | 105 | 10244 | −97.6 |
| 10.251 | 105 | 10243 | −96.9 |
| 10.252 | 105 | 10242 | −96.1 |
| 10.253 | 105 | 10241 | −95.0 |
| 10.254 | 105 | 10240 | −93.8 |
| 10.255 | 105 | 10239 | −92.3 |

IV. VARIABLE R SYNTHESIZERS CONNECTED TOGETHER

Figure 4:
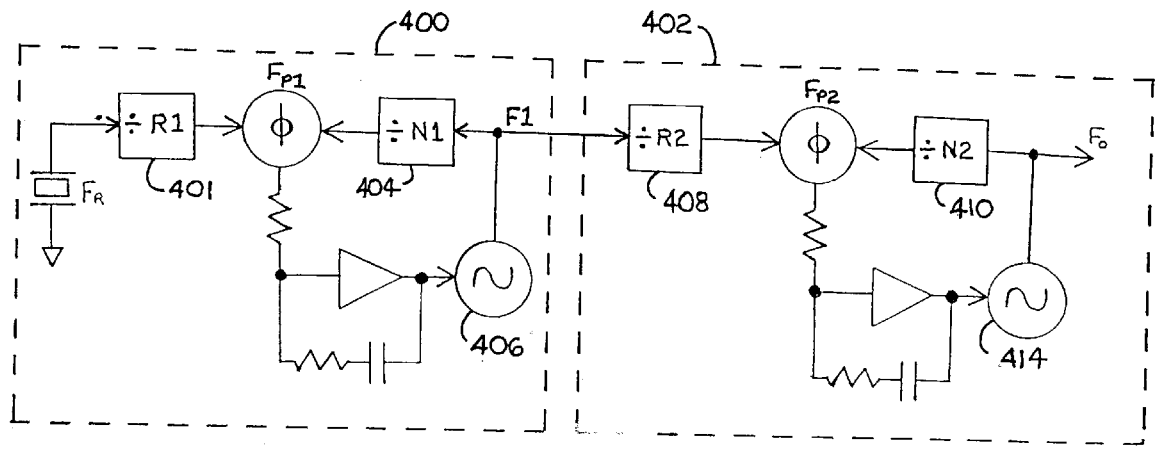
FIG. 4 shows connection of two variable R synthesizers to form a single frequency synthesizer.

To provide greater resolution, multiple variable R synthesizers can be connected together. FIG. 4 shows connection of two variable R synthesizers 400 and 402 to form a single frequency synthesizer.

In FIG. 4, the first variable R synthesizer 400 includes a divide by R1 frequency divider 401, a divide by N1 frequency divider 404, and other components connected as shown in FIG. 3 where R1 may be varied. The output of the VCO 406 (F1) in variable R synthesizer 400 forms the input of a divide by R2 frequency divider 408 in the second variable R frequency synthesizer 402.

The second variable R synthesizer 402 further includes a divide by N2 frequency divider 410 having an output connected along with the output of the divide by R2 frequency divider 408 to inputs of a phase detector. The phase detector output is then coupled through an integrator to a VCO 414. The VCC 414 output provides an input to the divide by N2 frequency divider 410 and forms the output Fo of the newly created synthesizer.

As connected the output F1 of synthesizer 400 is F1=$F_R$N1/R1. The output Fo of the synthesizer 402 is similarly Fo=F1R2/N2. Combining the equations for F1 and Fo, we obtain the output frequency Fo as follows:

$$Fo=F_R R1R2/N1N2$$

With R1, R2, N1 and N2 all being variable, resolution can be defined as follows:

$$RES=F_R(R1+1)(R2+1)/((N1+1)(N2+1))-F_R R1R2/N1N2$$

With N1, N2, R1 and R2 varied, again, a constant RES value is not maintained with changing Fo without error.

Table E below shows values for desired Fo, R1, R2, N1, N2, error in Fo for a synthesizer as shown in FIG. 4, and R1, R2, N1 and N2 chosen utilizing an iterative process. Similar to Table B, parameters are given for a desired 1 KHz resolution Fo=10.245 MHz±10 KHz, and $F_R$=10 MHz.

TABLE E

| Fo (MHz) | R1 | R2 | N1 | N2 | Error (Hz) |
|---|---|---|---|---|---|
| 10.235 | 40 | 5467 | 5459 | 41 | −0.91 |
| 10.236 | 40 | 5125 | 5118 | 41 | +0.00 |
| 10.237 | 40 | 5519 | 5512 | 41 | +0.54 |
| 10.238 | 40 | 5125 | 5119 | 41 | +0.00 |
| 10.239 | 40 | 5591 | 5585 | 41 | −0.18 |
| 10.240 | 40 | 5125 | 5120 | 41 | +0.00 |
| 10.241 | 40 | 5694 | 5689 | 41 | +0.70 |
| 10.242 | 40 | 5125 | 5121 | 41 | +0.00 |
| 10.243 | 40 | 5857 | 5853 | 41 | +0.17 |
| 10.244 | 40 | 5125 | 5122 | 41 | +0.00 |
| 10.245 | 42 | 5931 | 5935 | 43 | −0.04 |
| 10.246 | 40 | 5124 | 5122 | 41 | +0.78 |
| 10.247 | 42 | 5749 | 5754 | 43 | +0.52 |
| 10.248 | 40 | 5123 | 5122 | 41 | +0.78 |
| 10.249 | 41 | 6028 | 6031 | 42 | −0.60 |
| 10.250 | 42 | 6020 | 6027 | 43 | +0.00 |
| 10.251 | 41 | 5773 | 5777 | 41 | −0.24 |
| 10.252 | 40 | 5123 | 5124 | 40 | −0.78 |
| 10.253 | 41 | 5630 | 5635 | 41 | −0.04 |
| 10.254 | 40 | 5124 | 5126 | 40 | −0.78 |
| 10.255 | 41 | 5538 | 5544 | 41 | −0.92 |

With R1, N1, and N2 ranging as shown in Table E, $F_{p1}$ and $F_{p2}$ will both be greater than 238 KHz making settling time less than 30 μsec. As can be seen, a 30 μsec settling time is significantly less than the 7.2 msec settling time of the fixed R synthesizer of Table A, and also less than the settling times with single variable R synthesizers of Tables B, C or D which are equal to or greater than 72 μsec.

V. RATIO SUM SYNTHESIZER USING TWO VARIABLE R SYNTHESIZERS

In an additional embodiment of the present invention, multiple variable R synthesizers are used to form a "ratio sum" synthesizer. A ratio sum synthesizer is defined as having an output frequency proportional to a sum of N/R ratios of their variable R synthesizers.

Figure 5:
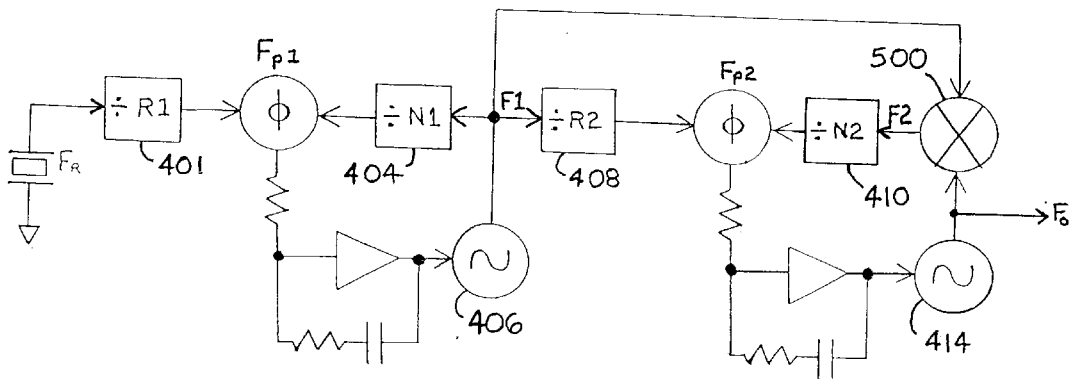
FIG. 5 shows a first embodiment of a ratio sum synthesizer.

FIG. 5 shows a first embodiment of a ratio sum synthesizer. The sum ratio synthesizer of FIG. 5 includes two variable R synthesizers connected similar to those in FIG. 4. In addition to the components of FIG. 4, the ratio sum synthesizer of FIG. 5 includes a mixer 500 having an input to output path connecting the output of VCO 414 to the input of the divide by N2 frequency divider 410. A second input of mixer 500 is connected to the output of VCO 406. As in FIG. 4, the output of VCO 414 provides the synthesizer output Fo. The output of mixer 500 provides a signal labeled F2. For convenience, components carried over from FIG. 4 to FIG. 5 are similarly labeled.

In operation, the output frequency for each of the variable R synthesizers making up the ratio sum synthesizer of FIG. 5 can be determined using the following equations:

$$F1 = F_R N1/R1$$

$$F2 = F1 N2/R2 = F1 - Fo$$

Using the equations for F1 and F2, the frequency Fo can be derived as follows:

$$Fo = F1(1 - N2/R2)$$

$$= F_R N1/R1(1 - N2/R2)$$

The term "ratio sum" is derived from this equation for Fo with knowledge that R1, R2, N1 and N2 are all variable. As can been seen, Fo is proportional to the "sum" of the N/R "ratios" of the variable R synthesizers making up a "sum ratio" synthesizer.

VI. RATIO SUM SYNTHESIZER USING THREE VARIABLE R SYNTHESIZERS

Figure 6:
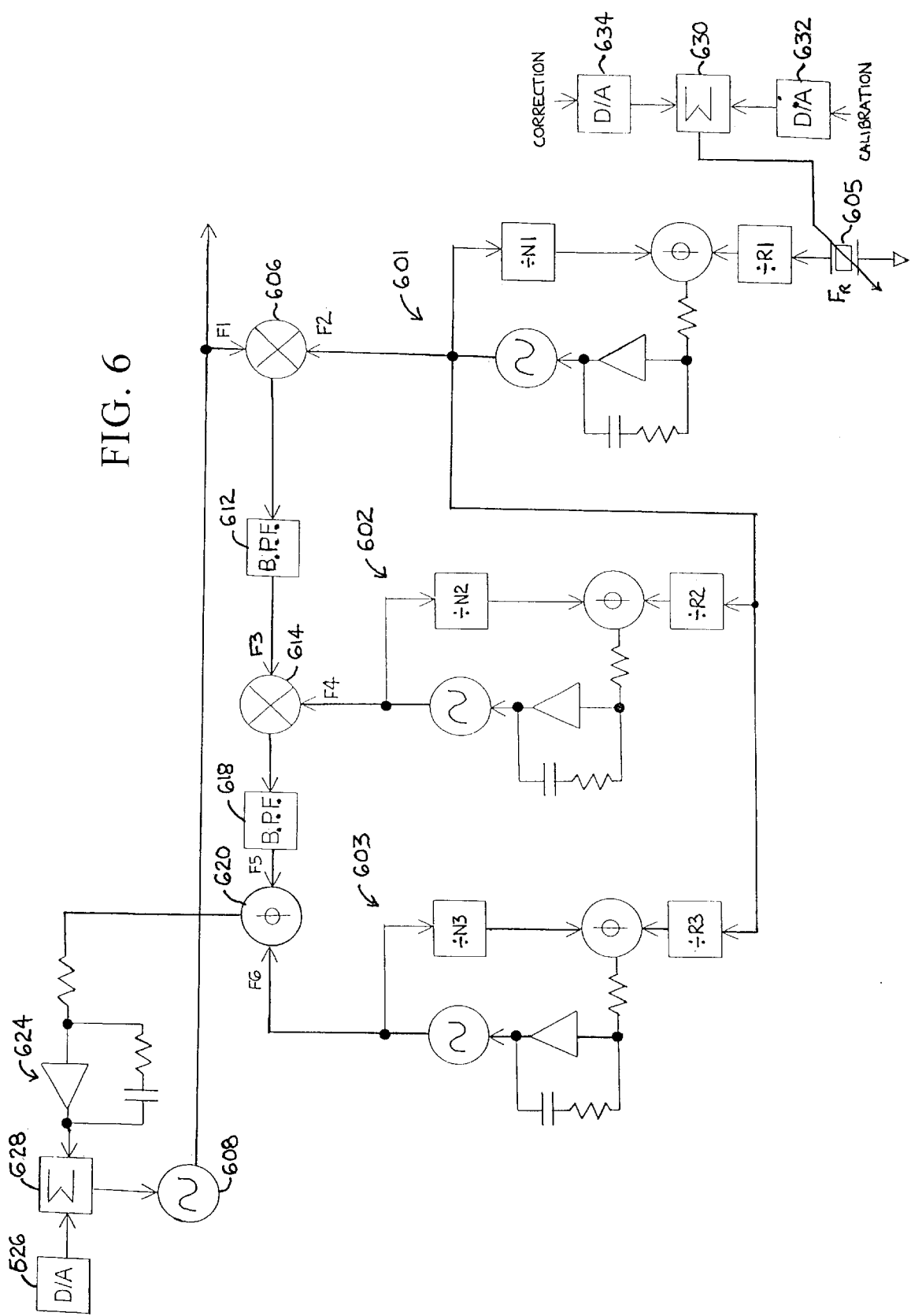
FIG. 6 shows a second embodiment of a ratio sum synthesizer.

FIG. 6 shows a second embodiment of a ratio sum synthesizer utilizing three variable R synthesizers 601–603. As configured, the ratio sum synthesizer of FIG. 6 can provide an output of 600–1200 MHz with a 0.1 Hz resolution and settling time below 50 μsec utilizing less components than the circuitry of FIGS. 2A–2B.

In FIG. 6, a reference oscillator 605 provides a reference signal having a frequency $F_R$ to the input of the variable R synthesizer 601 at its divide by R1 frequency divider. Unlike with the oscillator 205 of FIG. 2A, the reference oscillator 605 is preferably an internal component to the synthesizer, rather than being provided from an external reference, enabling the synthesizer of FIG. 6 to be used in a field testing device. The reduced number of components of the circuit of FIG. 6 from the circuit of FIGS. 2A–2B further reduce size of the synthesizer enabling the design to be more readily used in a portable field testing device.

The reference oscillator 605, unlike the reference oscillator 205 of FIG. 2A, also has a variable output as controlled by a signal from summer 630. The summer 630 receives a control voltage signal from a D/A converter 632, and from a D/A converter 634. The voltage from D/A converter 632 is utilized to assure oscillator 605 has a frequency centered at a desired value $F_R$. The voltage from D/A converter 634 is utilized to offset the desired center frequency $F_R$ to correct for any resolution error due to the use of variable R synthesizers 601–603.

In contrast with the reference oscillator 205 of FIG. 2A, the reference oscillator 605 further does not provide a connection to the remaining variable R synthesizers 602–603. The output of the variable R synthesizer 601 (F2) is provided as a reference to the input of the variable R synthesizer 602 at its divide by R2 frequency divider, and to the input of the variable R synthesizer 603 at its divide by R3 frequency divider. Variation of R2 and R3 enables the high frequency output (F2) of variable R synthesizer 601 to be used as a reference, rather than the reference oscillator 605 output.

The output of the variable R synthesizer 601 (F2) is also provided to a first input of a mixer 606, while a second input of the mixer 206 is provided from an output (F1) of a VCO 608. The output of VCO 608 provides the output (F1) for the circuitry of FIG. 6. The output of mixer 606 provides a signal (F3) through band pass filter (B.P.F.) 612 having a frequency equal to the difference in the signals F1 and F2 to a first input of additional mixer 614.

The output of the variable R synthesizer 602 (F4) is provided directly to the second input of mixer 614, rather than through an additional frequency divider as with synthesizer 202 of FIG. 2A, due to R2 being variable. The output of mixer 614 provides a signal (F5) through band pass filter 618 having a frequency equal to the difference in the signals F3 and F4 to an input of a phase detector 620.

The output of the variable R synthesizer 603 (F6) is provided directly to a second input of phase detector 620, rather than through an additional frequency divider as with synthesizer 203 of FIG. 2A, due to R3 being variable. The output of the phase detector 620 is then coupled through an integrator 624 to the voltage control input of VCO 608.

Because the output frequency of VCO 608 is divided down through two mixers 606 and 614 before being provided to phase detector 620, a significant variation in the initial frequency of VCO 608 from a predicted value used to set the output frequencies of variable R synthesizers 601–603 may prevent the circuitry of FIG. 6 from locking the output frequency of VCO 608. To presteer the output frequency of VCO 608 to a desired initial frequency, and assure lock, a user controlled D/A converter 626 is provided. The D/A converter 626 has its output connected through summer 628 along with the output of integrator 624 to provide the voltage control input to VCO 608.

In operation, the output frequency of each of the variable R synthesizers can be determined utilizing the following equations:

$$F2 = F_R N1/R1$$

$$F4 = F2 N2/R2$$

$$F6 = F2 N3/R3$$

Using the equations for F2 and F4, the frequencies of signals output from mixers 606 and 614 can be determined as follows:

$$F3 = F2 - F1 = F_R N1/R1 - F1$$

$$F5 = F3 - F4$$
$$= F_R N1/R1 - F1 - F2 N2/R2$$
$$= F_R N1/R1 - F1 - F_R N1 N2/(R1 R2)$$
$$= F_R N1/R1(1 - N2/R2) - F1$$

With the phase detector 620 assuring that the signals F5 and F6 are equal, the frequency of signal F1 can be derived from the above equation for F5 and F6 as follows:

$$F1 = F_R N1/R1(1 - N2/R2) - F2 N3/R3$$
$$= F_R N1/R1(1 - N2/R2) - F_R N1 N3/(R1 R3)$$
$$= F_R N1/R1(1 - N2/R2 - N3/R3)$$

Thus, the output (F1) of the synthesizer of FIG. 6 is proportional to the difference of the N/R ratios of the variable R synthesizers of which it is composed so the term "ratio sum" synthesizer is used to describe it similar to FIG. 5.

FIGS. 7A–7D show a flow chart illustrating a method to iteratively determining values for N1, R1, N2, R2, N3 and R3 for the sum ratio synthesizer of FIG. 6 with a desired F1 ranging from 600–1200 MHz in steps of 5 MHz, a settling time less than 50 μsec, and a possible resolution of 0.1 Hz. Appendix A further includes a program written in BASIC™ to perform the steps of the method shown in the flow chart of FIGS. 7A–7D. Appendix B shows the results of a run of the program of Appendix A.

Figure 7A:
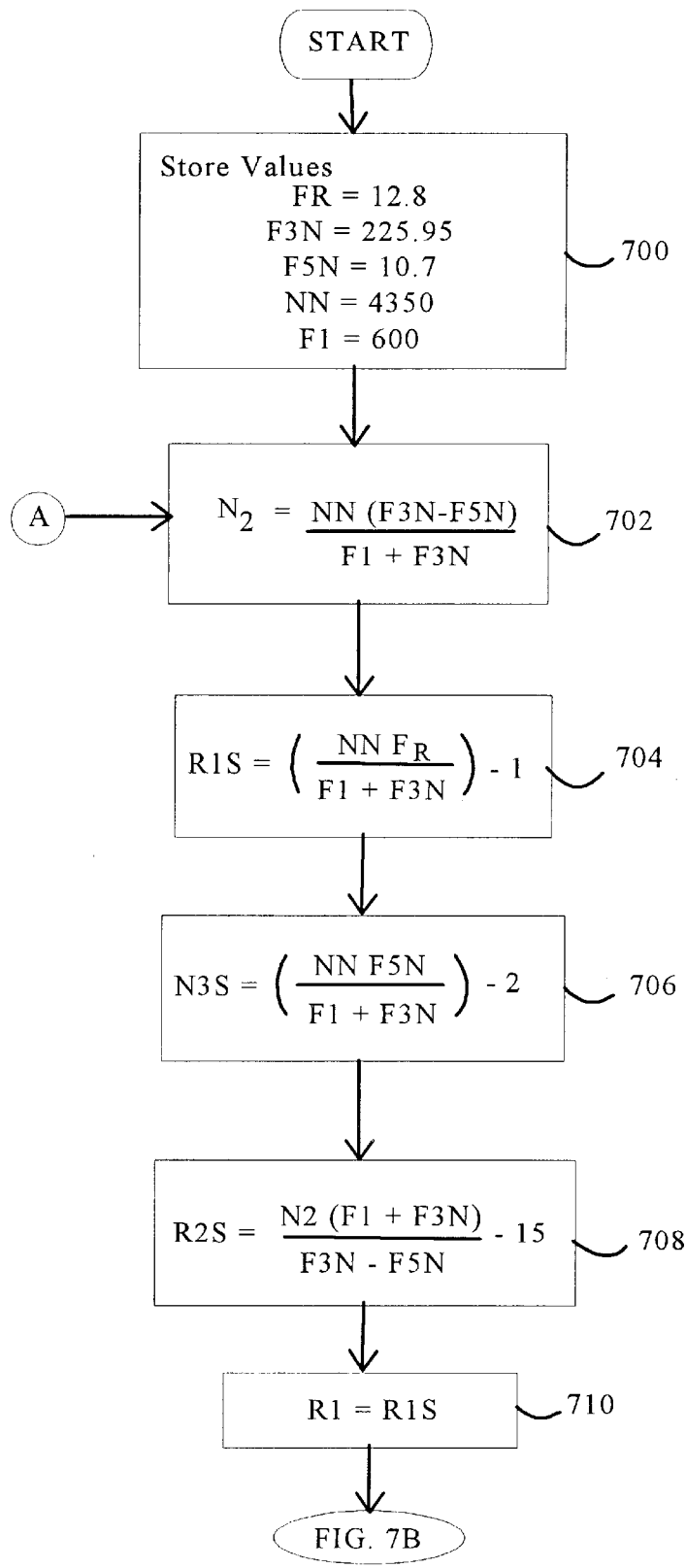
FIGS. 7A–7D show a flow chart providing a method to iteratively determine values for N1, R1, N2, R2, N3 and R3 for the sum ratio synthesizer of FIG. 6.
Figure 7B:
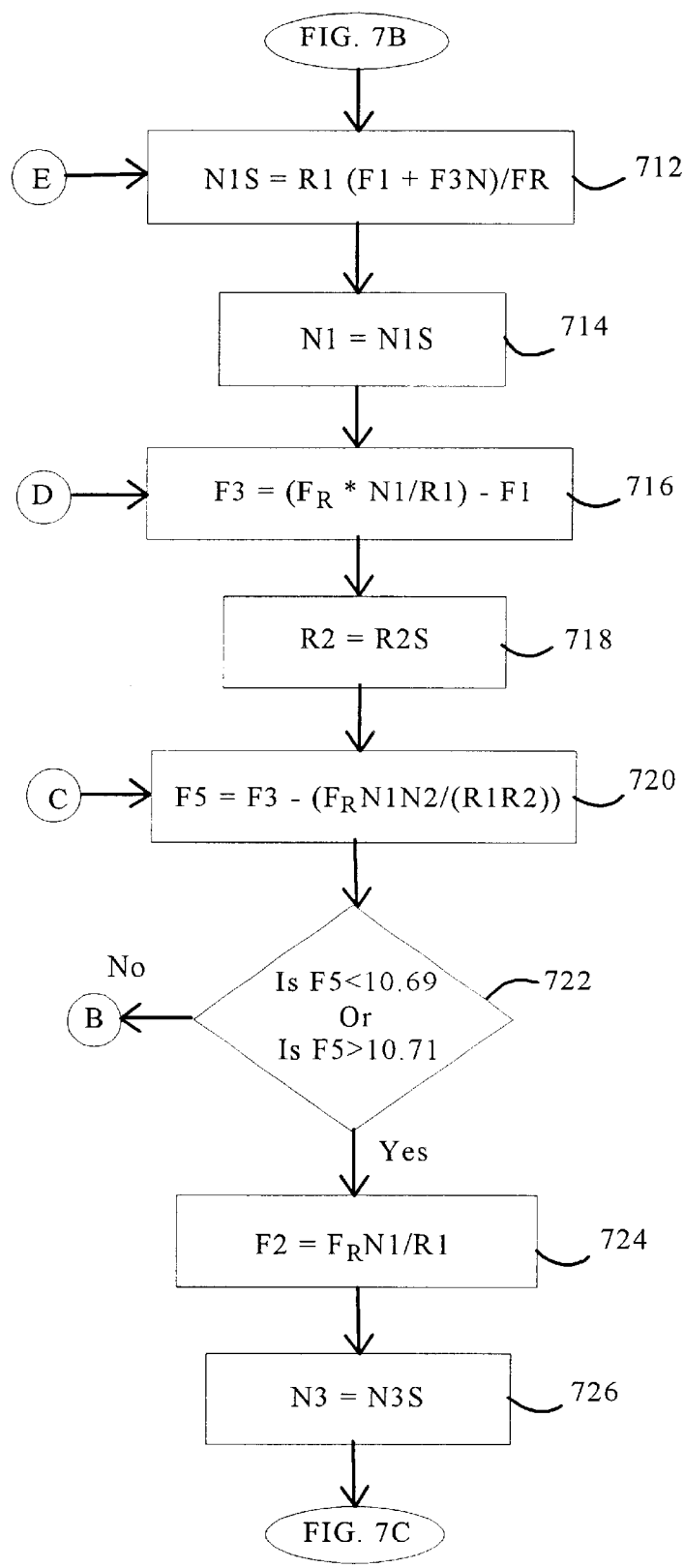
Figure 7C:
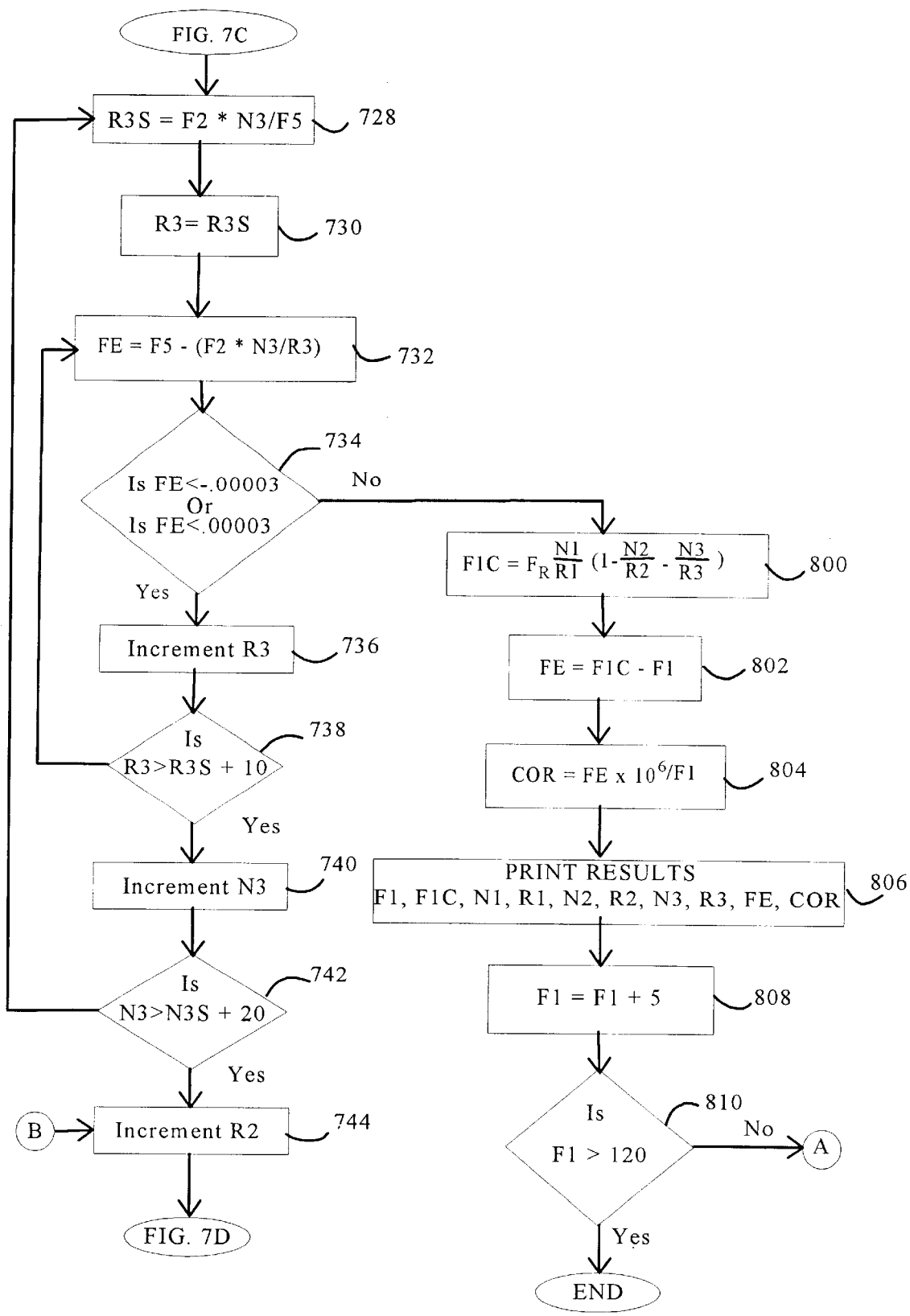
Figure 7D:
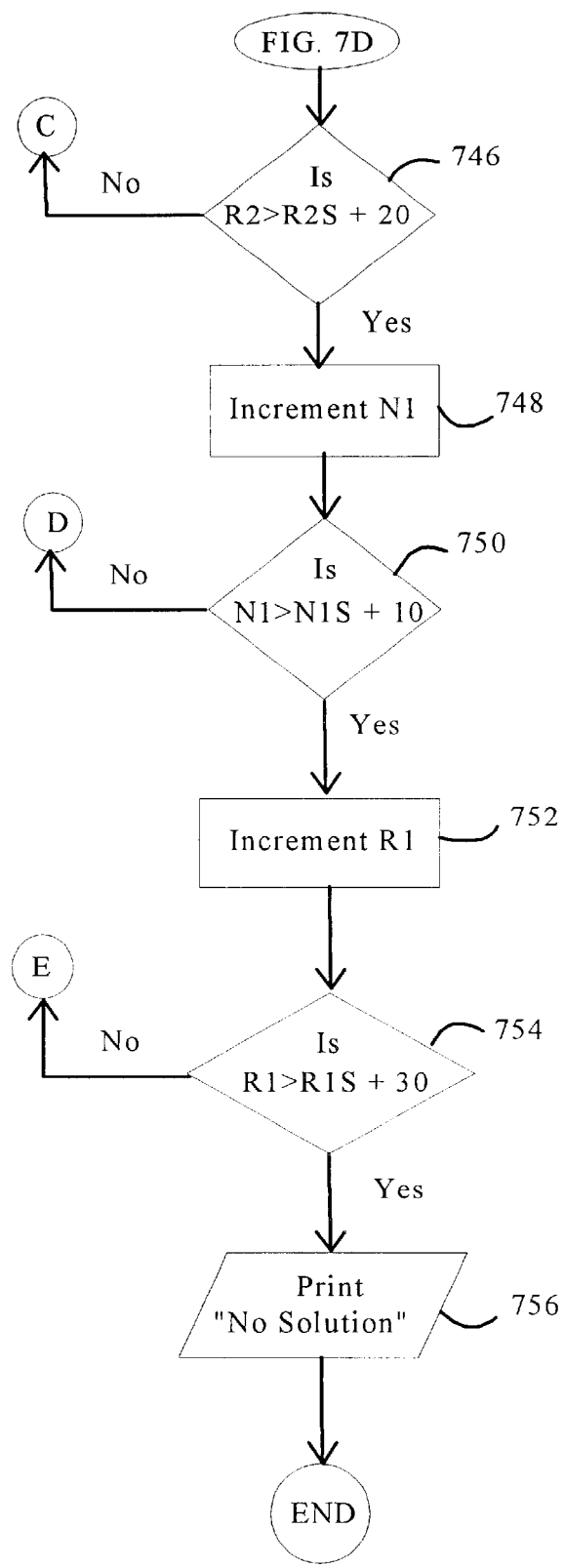

In step 700 of FIG. 7A, the value of $F_R$ is set as 12.8 MHz. Note that values in FIGS. 7A–7D are rounded off to the nearest MHz. Further in step 700, a variable F3N is defined as 225.95 MHz to provide an initial value for F3, and a variable F5N is defined to be 10.7 MHz to provide an initial value for F5. A variable NN is also set at 4350 to provide an initial value for N1, R1 and R2. Finally in step 700, the first value of F1 is initialized to 600 MHz.

In step 702, a value for N2 is determined with knowledge that F2/R2=F4/N2, F2=F3+F1 and F5=F3−F4 as discussed above with respect to FIG. 6. With values from step 600, F2/R2=(F3N+F1)/NN and F4/N2=(F3N−F5N)/N2, and N2 is derived to be N2=NN(F3N−F5N)/(F1+F3N).

In step 704, a variable R1S is defined to provide an initial value for R1. An equation for R1S is determined with knowledge that $F_R$/R1=F2/N1, and F3=F2−F1, as discussed previously. With the values from step 700, F2/N1=(F3+F1)/NN, and R1 is derived to be R1=NNF$_R$/(F1+F3N). R1S is then defined as the derived value for R1 minus 1 to set an initial value for iteration.

In step 706, a variable N3S is defined to provide an initial value for N3. The equation for N3S is determined with knowledge that F2/R3=F6/N3, F6=F5, and F2=F3+F1 as discussed previously. With the values from step 600, F2/R3=(F3N+F1)/NN, and N3 is derived to be N3=NNF5N/(F1+F3N). N3S is then defined as the derived value for N3 minus 2 to set an initial value for iteration.

In step 708, a variable R2S is defined to provide an initial value for R2. The equation for R2S is determined with knowledge that F2/R2=F4/N2, F4=F3−F5, and F2=F3+F1 as discussed previously. With the values from steps 700 and 702, R2 is then derived as R2=N2(F1+F3N)/(F3N−F5N). R2S is then defined as the derived value for R2 minus 15 to set an initial value for iteration.

In step 710, the value for R1S is stored as R1, and in step 712 a variable N1S is defined to provide an initial value for N1 as calculated using R1 from step 710. The equation for N1S is determined with knowledge that N1=(R1/F$_R$)F2, and F2=F1+F3 as indicated previously. With the values from steps 700 and 710, N1 is then derived as N1=R1(F1+F3N)/F$_R$, and N1S is set equal to N1 for iteration.

In step 714, the value for N1S is stored as N1, and in step 716 F3 is calculated using N1 from step 714. The equation for F3 is determined in step 716 with knowledge that F3=F2−F1, and F2=F$_R$N1/R1 as indicated previously. With the values from steps 700, 710 and 714, F3 is then derived as F3=(F$_R$N1/R1)−F1.

In step 718, the value for R2S is stored as R2, and in step 720 F5 is calculated using R2 from step 718. The equation for F5 is determined in step 720 with knowledge that F5=F3−F4, F4=F2N2/R2 and F2=F$_R$N1/R1 as indicated previously. With the values from steps 700, 702, 710, 714, 7.16 and 718, F5 is then derived as F5=F3−(F$_R$N1N2 (R1R2)).

In step 722, a determination is made if F5 is outside the range of ±0.01 MHz from the initial value of 10.7 MHz set in step 700 as F5N. If so, the value for R2 is accepted, and step 724 is performed. If F5 it is outside the range, step 744 is performed wherein R2 is incremented and if R2 is not beyond a maximum range in step 746, the method returns to step 720 to recalculate F5 with the new value for R2.

In step 724, F2 is calculated using values from steps 700, 710 and 714 as F2=F$_R$N1/R1. Further, in step 726, the value for N3S is stored as N3, and in step 728 a variable R3S is determined with knowledge that F2/R3=F6/N3 and F6=F5 as indicated previously. Using F5 from step 720, F2 from step 724 and N3 from step 726, R3 is derived as R3=F2N3/F5, and R3S is set equal to R3 in step 728. In step 730, the value for R3 is set to R3S.

In step 732 an error value FE is calculated as the difference in the inputs F5 and F6 to phase detector 620 of FIG. 6. Using the values of steps 724, 726 and 730 F6=(F2/R3)N3 and, using the value of F5 from step 720, FE=F5−(F2N3/R3) as indicated in step 732.

In step 734, a determination is made if FE is outside the range of ±0.00003 MHz. Although the maximum error for. FE is chosen in step 734 as ±0.00003 MHz, another value can be chosen as desired. If FE is outside desired limits, iteration continues beginning in step 736.

To continue iteration in step 736, R3 is incremented. Then in step 738 if the value for R3 is not beyond a maximum range of R3S+10, the method returns to step 732 to recalculate FE with the new value for R3, but if R3 is beyond the maximum range of R3S+10, the method proceeds to step 740.

In step 740 N3 is incremented. Then in step 742 if the value for N3 is not beyond a maximum range of N3S+20, the method returns to step 728 to continue iteration with the new value for N3, but if N3 is beyond the maximum range of N3S+20, the method proceeds to step 744.

In step 744 R2 is incremented. Then in step 746 if the value for R2 is not beyond a maximum range of R2S+20, the method returns to step 720 to continue iteration with the new value for R2, but if R2 is beyond the maximum range of R2S+20, the method proceeds to step 748.

In step 748 N1 is incremented. Then in step 750 if the value for N1 is not beyond a maximum range of N1S+10, the method returns to step 716 to continue iteration with the new value for N1, but if N1 is beyond the maximum range of N1S+20, the method proceeds to step 752.

In step 752 R1 is incremented. Then in step 754 if the value for R1 is not beyond a maximum range of R1S+30, the method returns to step 712 to continue iteration with the new value for R1, but if R1 is beyond the maximum range of N1S+20, the method proceeds in step 756 to indicate to the user that no solution exists for the desired iteration values and operation ends.

Limits for the iteration values are chosen in steps 738, 742, 746, 750 and 754 by allowing the respective variables R3, N3, R2, N1 and R1 to be incrementally increased to a maximum limit as selected by a user. For instance step 738 enables R3 to be incremented from R3S up to R3S+10. Although particular maximums are utilized in FIGS. 7A–7D, other values may be utilized. Similarly, initial values for R3, N3, R2, N1 and R1 are chosen depending on the users desire. For instance R1S is chosen in step 704 as a calculated value for R1 minus 1, the value "1" being arbitrarily set by a user. Similarly in step 708, R2S is chosen to be a calculated value minus 15, the value "15" being arbitrarily set by a user.

To prepare for the process of printing results, in step 800 a value F1C is defined to provide a result for the actual value of F1. F1C is defined as the value for F1 calculated previously with respect to FIG. 6 as F1C=N1/R1(1−N2/R2−N3/R3). Further in step 802, an error value FE is calculated as the difference in the actual value for F1, F1C, and the desired value for F1 which is actually stored as F1.

Finally to prepare for printing results, in step 804 a value COR is defined which can be utilized to control D/A converter 634, and thus be provided to oscillator 605 to correct for the difference in the desired and actual values of F1. COR is defined in parts per million as COR=FE*1000000/F1.

In step 806, the results for F1, F1C, N1, R1, N2, R2, N3, R3, FE and COR are printed. In a subsequent step 808, F1 is increased by the desired frequency step size (here 5 MHz), and in step 810 if F1 is greater than the maximum desired value of 1200 MHz, then the program ends, but if F1 is still below 1200 MHz, the method returns to step 704 to calculate new results for the new desired F1 value.

Note that in line 90 of the BASIC™ program in Appendix A that if F1>700 MHz that N2, R1S and N3S have set values enabling steps 702–706 of the flow chart of FIG. 7A to be skipped.

With $F_R$, F2, F3, F5 and F4 having values set near $F_R$=12.8 MHz, F3=225.95 MHz, F5=10.7 MHz and F4=215.25 MHz, referring to step 700 of FIG. 7A, the minimum frequency value provided to the phase detectors in variable R frequency synthesizers with the values in Appendix B will be approximately 155 KHz, or $F6/N3_{max}$=10.7 MHz/71=150 KHz. The approximate maximum settling time for the circuit of FIG. 6 with the values of Appendix B will thus be $t_{settle}$=(4.5/2π(150 KHz)/10)=47 μsec.

With a fixed time base $F_R$ and all the values N1, R1, N2, R2, N3 and R3 being varied as shown in Appendix B, output resolution is maintained below approximately 100 Hz. However, with correction applied using converter 634, an output resolution can be maintained as low as 1 Hz with the output ranging from 600–1200 MHz and with settling time held below 72 μsec.

Although the invention has been described above with particularity, this was merely to teach one of ordinary skill in the art how to make and use the invention. Many modifications will fall within the scope of the invention, as that scope is defined by the claims which follow.

APPENDIX A

BASIC ™ PROGRAM FOR FLOW CHART OF FIG. 6

```
40   FR=12.8    :FR#=INT (10*FR+.0001)/10#
50   F3N=225.95  :F5N=10.7  :F2N=F3N-F5N  :NN=4350
60   K1=FR*NN   :K2=F5N*NN   :K3=F2N*NN/64
70   F1#=600#
80   F1=F1#
90   IF F1>700 THEN N2=960  :R1S=56  :N3S=47  :GOTO 130
100  N2=64*INT  (K3/(F1+F3N))
110  R1S=INT   (K1/(F1+F3N))-1
120  N3S=INT   (K2/(F1+F3N))-2
130  R2S=INT   (R2*(F1+F3N)/F2N)-15
140  FOR R1=R1S to R1S+30
150  N1S=INT   (R1*(F1+F3N)/FR)
160  FOR N1=N1S to N1S+10
170  F3=(FR*N1/R1)-F1
180  FOR R2=R2S to R2S+20
190  F5=F3-(FR*N1*N2/(R1*R2))
200  IF F5<10.69 or F5>10.71 THEN 300
210  F2=FR*N1/R1
220  FOR N3=N3S to N3S+20
230  R3S=INT   (F2/(F5/N3))
240  FOR R3=R3S to R3S+10
250  FE=F5-(F2*N3/R3)
260  IF FE <-.00003 OR FE>.00003 THEN 280
270  GOTO 340
280  NEXT R3
290  NEXT N3
300  NEXT R2
310  NEXT N1
320  NEXT R1
330  PRINT "NO SOLUTION AT";F1#;"1MHZ" :STOP
340  N1#=INT(N1+.5)  :R1#=INT(R1+.5)  :R2#=INT(R2+.5)
     :N2#=INT(N2+.5)  :R3#=INT(R3+.5)  :N3#=INT(N3+.5)
350  F1C=#FR#*(N1#/R1#)*(1#-(N2#/R2#)-(N3#/R3#))
360  FE#=F1C#-F1#
370  IF F1>600 THEN 410
380  LPRINT " Fp  Fo  N1  R1  N2  R2  N3  R3  ERR(Hz)
     COR(ppm)  "
410  LPRINT USING "####";F1#;
430  LPRINT USING "####.#######";F1C#;
450  LPRINT USING "#####"; N1;
470  LPRINT USING "##";  R1;
490  LPRINT USING "#####"; N2;
510  LPRINT USING "####"; R2;
530  LPRINT USING "#####"; N3;
550  LPRINT USING "###"; R3;
570  LPRINT USING "+###.#";FE#*1000000;
590  LPRINT USING "+.####";-FE#*10000000#/F1#
610  IF F1#=1200# THEN 650
620  F1#=F1#+F5#
630  IF F1#>1200# THEN F1#=1200#
640  GOTO 80
650  END
```

APPENDIX B

RESULTS OF PROGRAM OF APPENDIX A

| F1 | F1(Actual) | N1 | R1 | N2 | R2 | N3 | R3 | ERR(Hz) | COR(ppm) |
|---|---|---|---|---|---|---|---|---|---|
| 600 | 599.9999806 | 4327 | 67 | 1088 | 4165 | 58 | 4477 | −19.4 | +.0324 |
| 605 | 605.0000257 | 4290 | 66 | 1088 | 4185 | 62 | 4821 | +25.7 | −.0425 |
| 610 | 609.9999931 | 4379 | 67 | 1088 | 4216 | 70 | 5477 | −6.9 | +.0114 |
| 615 | 615.0000264 | 4270 | 65 | 1088 | 4252 | 58 | 4557 | +26.4 | −.0430 |
| 620 | 619.9999833 | 4229 | 64 | 1088 | 4278 | 68 | 5379 | −16.7 | +.0270 |
| 625 | 625.0000038 | 4321 | 65 | 1088 | 4302 | 71 | 5643 | +3.8 | −.0060 |
| 630 | 630.0000620 | 4413 | 66 | 1088 | 4328 | 65 | 5197 | +62.0 | −.0984 |
| 635 | 634.9999879 | 4237 | 63 | 1024 | 4097 | 63 | 5073 | −12.1 | +.0191 |
| 640 | 639.9999978 | 4263 | 63 | 1024 | 4117 | 69 | 5583 | −2.2 | +.0035 |
| 645 | 644.9999355 | 4292 | 63 | 1024 | 4128 | 56 | 4560 | −64.5 | +.1000 |
| 650 | 649.9999784 | 4451 | 65 | 1024 | 4159 | 60 | 4916 | −21.6 | +.0332 |
| 655 | 655.0000442 | 4268 | 62 | 1024 | 4188 | 57 | 4698 | +44.2 | −.0675 |
| 660 | 660.0000222 | 4223 | 61 | 1024 | 4212 | 69 | 5712 | +22.2 | −.0336 |
| 665 | 664.9999842 | 4247 | 61 | 1024 | 4235 | 67 | 5584 | −15.8 | +.0238 |
| 670 | 670.0000403 | 4273 | 61 | 1024 | 4252 | 58 | 4862 | +40.3 | −.0601 |
| 675 | 675.0000066 | 4227 | 60 | 1024 | 4274 | 63 | 5305 | +6.6 | −.0097 |
| 680 | 680.0000267 | 4249 | 60 | 1024 | 4302 | 51 | 4324 | +26.7 | −.0393 |
| 685 | 684.9999810 | 4270 | 60 | 1024 | 4334 | 69 | 5871 | −19.0 | +.0277 |
| 690 | 690.0000216 | 4370 | 61 | 960 | 4070 | 58 | 4974 | +21.6 | −.0313 |
| 695 | 695.0000151 | 4247 | 59 | 960 | 4101 | 60 | 5168 | +15.1 | −.0217 |
| 700 | 699.9999906 | 4268 | 59 | 960 | 4130 | 60 | 5188 | −9.4 | +.0135 |
| 705 | 704.9999919 | 4145 | 57 | 960 | 4154 | 65 | 5657 | −8.1 | +.0115 |
| 710 | 710.0000066 | 4242 | 58 | 960 | 4171 | 62 | 5426 | +6.6 | −.0093 |
| 715 | 714.9999870 | 4118 | 56 | 960 | 4192 | 61 | 5365 | −13.0 | +.0181 |
| 720 | 720.0000437 | 4213 | 57 | 960 | 4217 | 53 | 4685 | +43.7 | −.0606 |
| 725 | 724.9999638 | 4161 | 56 | 960 | 4239 | 57 | 5069 | −36.2 | +.0500 |
| 730 | 729.9999953 | 4260 | 57 | 960 | 4253 | 52 | 4650 | −4.7 | +.0064 |
| 735 | 735.0000235 | 4280 | 57 | 960 | 4283 | 53 | 4763 | +23.5 | −.0320 |
| 740 | 740.0000569 | 4228 | 56 | 960 | 4301 | 48 | 4337 | +56.9 | −.0769 |
| 745 | 745.0000866 | 4248 | 56 | 960 | 4330 | 50 | 4538 | +86.6 | −.1162 |
| 750 | 750.0000534 | 4273 | 56 | 960 | 4341 | 55 | 5023 | +53.4 | −.0711 |
| 755 | 755.0000746 | 4368 | 57 | 960 | 4376 | 62 | 5684 | +74.6 | −.0988 |
| 760 | 760.0000021 | 4315 | 56 | 960 | 4392 | 64 | 5897 | +2.1 | −.0028 |
| 765 | 765.0000521 | 4335 | 56 | 960 | 4421 | 54 | 5002 | +52.1 | −.0680 |
| 770 | 769.9999866 | 4357 | 56 | 960 | 4443 | 58 | 5396 | −13.4 | +.0174 |
| 775 | 775.0000195 | 4383 | 56 | 960 | 4450 | 52 | 4867 | +19.5 | −.0251 |
| 780 | 779.9999816 | 4402 | 56 | 960 | 4483 | 63 | 5920 | −18.4 | +.0236 |
| 785 | 785.0000192 | 4422 | 56 | 960 | 4512 | 50 | 4727 | +19.2 | −.0244 |
| 790 | 789.9999715 | 4525 | 57 | 960 | 4528 | 56 | 5316 | −28.5 | +.0360 |
| 795 | 795.0000255 | 4546 | 57 | 960 | 4555 | 58 | 5532 | +25.5 | −.0320 |
| 800 | 799.9998971 | 4572 | 57 | 960 | 4563 | 55 | 5282 | −102.9 | +.1286 |
| 805 | 804.9999768 | 4512 | 56 | 960 | 4592 | 52 | 5008 | −23.2 | +.0288 |
| 810 | 809.9999161 | 4613 | 57 | 960 | 4621 | 66 | 6392 | −83.9 | +.1035 |
| 815 | 814.9999378 | 4717 | 58 | 960 | 4642 | 51 | 4958 | −62.2 | +.0764 |
| 820 | 819.9999801 | 4576 | 56 | 960 | 4665 | 63 | 6158 | −19.9 | +.0243 |
| 825 | 825.0000000 | 4598 | 56 | 960 | 4687 | 67 | 6575 | −0.0 | +.0000 |
| 830 | 830.0000240 | 4705 | 57 | 960 | 4699 | 59 | 5822 | +24.0 | −.0289 |
| 835 | 835.0000679 | 4724 | 57 | 960 | 4734 | 59 | 5847 | +67.9 | −.0813 |
| 840 | 840.0000450 | 4664 | 56 | 960 | 4752 | 51 | 5085 | +45.0 | −.0535 |
| 845 | 844.9999481 | 4687 | 56 | 960 | 4770 | 58 | 5805 | −51.9 | +.0614 |
| 850 | 849.9999791 | 4707 | 56 | 960 | 4800 | 49 | 4923 | −20.9 | +.0246 |
| 855 | 854.9999346 | 4898 | 58 | 960 | 4821 | 62 | 6268 | −65.4 | +.0765 |
| 860 | 859.9999511 | 4753 | 56 | 960 | 4835 | 50 | 5080 | −48.9 | +.0568 |
| 865 | 865.0000186 | 4773 | 56 | 960 | 4865 | 61 | 6224 | +18.6 | −.0215 |
| 870 | 870.0000470 | 4794 | 56 | 960 | 4891 | 63 | 6455 | +47.0 | −.0540 |
| 875 | 874.9999377 | 4816 | 56 | 960 | 4913 | 57 | 5862 | −62.3 | +.0712 |
| 880 | 879.9999397 | 4842 | 56 | 960 | 4918 | 47 | 4859 | −60.3 | +.0686 |
| 885 | 885.0000086 | 4863 | 56 | 960 | 4944 | 53 | 5501 | +8.6 | −.0097 |
| 890 | 890.0000355 | 4969 | 57 | 960 | 4979 | 52 | 5423 | +35.5 | −.0399 |
| 895 | 894.9999834 | 4904 | 56 | 960 | 5000 | 61 | 6391 | −16.6 | +.0185 |
| 900 | 899.9999810 | 4928 | 56 | 960 | 5013 | 63 | 6637 | −19.0 | +.0211 |
| 905 | 904.9999227 | 4947 | 56 | 960 | 5048 | 65 | 6866 | −77.3 | +.0854 |
| 910 | 909.9999417 | 5060 | 57 | 960 | 5060 | 51 | 5415 | −58.3 | +.0641 |
| 915 | 914.9999863 | 4992 | 56 | 960 | 5087 | 47 | 5013 | −13.7 | +.0150 |
| 920 | 920.0000367 | 5014 | 56 | 960 | 5109 | 48 | 5137 | +36.7 | −.0398 |
| 925 | 924.9999477 | 5035 | 56 | 960 | 5135 | 52 | 5592 | −52.3 | +.0566 |
| 930 | 929.9999301 | 5147 | 57 | 960 | 5158 | 55 | 5942 | −69.9 | +.0752 |
| 935 | 935.0000406 | 5080 | 56 | 960 | 5174 | 49 | 5317 | +40.6 | −.0435 |
| 940 | 939.9999688 | 5101 | 56 | 960 | 5200 | 61 | 6652 | −31.2 | +.0332 |
| 945 | 944.9999864 | 5123 | 56 | 960 | 5222 | 54 | 5908 | −13.6 | +.0144 |
| 950 | 949.9999915 | 5328 | 58 | 960 | 5247 | 47 | 5164 | −8.5 | +.0089 |
| 955 | 955.0000904 | 5166 | 56 | 960 | 5270 | 65 | 7172 | +90.4 | −.0946 |
| 960 | 960.0000003 | 5191 | 56 | 960 | 5278 | 65 | 7206 | +0.3 | −.0004 |
| 965 | 965.0000112 | 5211 | 56 | 960 | 5309 | 59 | 6563 | +11.2 | −.0116 |
| 970 | 969.9999983 | 5234 | 56 | 960 | 5326 | 54 | 6035 | −1.7 | +.0017 |

APPENDIX B-continued

RESULTS OF PROGRAM OF APPENDIX A

| F1 | F1(Actual) | N1 | R1 | N2 | R2 | N3 | R3 | ERR(Hz) | COR(ppm) |
|---|---|---|---|---|---|---|---|---|---|
| 975 | 974.9999592 | 5350 | 57 | 960 | 5347 | 66 | 7408 | −40.8 | +.0418 |
| 980 | 979.9999273 | 5277 | 56 | 960 | 5374 | 61 | 6874 | −72.7 | +.0742 |
| 985 | 984.9999627 | 5300 | 56 | 960 | 5391 | 57 | 6451 | −37.3 | +.0378 |
| 990 | 989.9999995 | 5320 | 56 | 960 | 5422 | 66 | 7501 | −0.5 | +.0005 |
| 995 | 995.0000351 | 5343 | 56 | 960 | 5439 | 50 | 5706 | +35.1 | −.0353 |
| 1000 | 1000.000101 | 5363 | 56 | 960 | 5470 | 51 | 5847 | +101.8 | −.1018 |
| 1005 | 1005.000025 | 5483 | 57 | 960 | 5483 | 48 | 5528 | +25.4 | −.0253 |
| 1010 | 1010.000012 | 5410 | 56 | 960 | 5499 | 54 | 6244 | +12.5 | −.0124 |
| 1015 | 1015.000002 | 5432 | 56 | 960 | 5521 | 53 | 6145 | +2.2 | −.0022 |
| 1020 | 1019.999933 | 5452 | 56 | 960 | 5552 | 58 | 6758 | −66.8 | +.0655 |
| 1025 | 1025.000011 | 5475 | 56 | 960 | 5569 | 47 | 5495 | +11.6 | −.0114 |
| 1030 | 1030.000023 | 5593 | 57 | 960 | 5601 | 62 | 7277 | +23.5 | −.0228 |
| 1035 | 1035.000088 | 5516 | 56 | 960 | 5627 | 48 | 5656 | +88.1 | −.0851 |
| 1040 | 1039.999936 | 5540 | 56 | 960 | 5639 | 67 | 7922 | −63.4 | +.0610 |
| 1045 | 1044.999968 | 5660 | 57 | 960 | 5667 | 56 | 6649 | −31.2 | +.0298 |
| 1050 | 1050.000061 | 5583 | 56 | 960 | 5687 | 57 | 6799 | +61.6 | −.0587 |
| 1055 | 1055.000028 | 5705 | 57 | 960 | 5709 | 52 | 6229 | +28.1 | −.0266 |
| 1060 | 1059.999913 | 5629 | 56 | 960 | 5720 | 49 | 5897 | −86.3 | +.0814 |
| 1065 | 1064.999907 | 5647 | 56 | 960 | 5762 | 50 | 6035 | −92.5 | +.0868 |
| 1070 | 1069.999936 | 5669 | 56 | 960 | 5784 | 56 | 6778 | −63.6 | +.0594 |
| 1075 | 1075.000037 | 5896 | 58 | 960 | 5797 | 52 | 6320 | +37.7 | −.0350 |
| 1080 | 1080.000077 | 5816 | 57 | 960 | 5822 | 47 | 5741 | +77.7 | −.0720 |
| 1085 | 1084.999951 | 5735 | 56 | 960 | 5849 | 58 | 7102 | −48.4 | +.0446 |
| 1090 | 1089.999973 | 5759 | 56 | 960 | 5860 | 61 | 7507 | −26.3 | +.0241 |
| 1095 | 1094.999976 | 5779 | 56 | 960 | 5892 | 54 | 6670 | −23.2 | *+.0212 |
| 1100 | 1099.999940 | 5804 | 56 | 960 | 5898 | 62 | 7689 | −60.0 | +.0545 |
| 1105 | 1104.999910 | 5824 | 56 | 960 | 5930 | 58 | 7220 | −89.9 | +.0813 |
| 1110 | 1109.999987 | 5845 | 56 | 960 | 5957 | 57 | 7119 | −12.9 | +.0116 |
| 1115 | 1115.000056 | 5866 | 56 | 960 | 5984 | 61 | 7645 | +56.9 | −.0511 |
| 1120 | 1119.999940 | 5890 | 56 | 960 | 5995 | 49 | 6165 | −60.0 | +.0536 |
| 1125 | 1125.000009 | 6015 | 57 | 960 | 6030 | 49 | 6189 | +9.0 | −.0080 |
| 1130 | 1129.999974 | 5932 | 56 | 960 | 6049 | 47 | 5955 | −25.9 | +.0230 |
| 1135 | 1135.000005 | 5955 | 56 | 960 | 6065 | 57 | 7255 | +5.1 | −.0045 |
| 1140 | 1139.999919 | 5977 | 56 | 960 | 6087 | 62 | 7910 | −80.3 | +.0705 |
| 1145 | 1144.999974 | 5998 | 56 | 960 | 6114 | 54 | 6915 | −25.2 | +.0220 |
| 1150 | 1150.000056 | 6127 | 57 | 960 | 6138 | 51 | 6561 | +56.4 | −.0491 |
| 1155 | 1154.999972 | 6042 | 56 | 960 | 6157 | 58 | 7487 | −27.4 | +.0237 |
| 1160 | 1160.000065 | 6063 | 56 | 960 | 6184 | 57 | 7387 | +65.0 | −.0561 |
| 1165 | 1164.999956 | 6085 | 56 | 960 | 6206 | 62 | 8054 | −44.0 | +.0378 |
| 1170 | 1170.000054 | 6108 | 56 | 960 | 6222 | 47 | 6129 | +54.2 | −.0464 |
| 1175 | 1174.999969 | 6129 | 56 | 960 | 6249 | 60 | 7856 | −30.1 | +.0257 |
| 1180 | 1179.999910 | 6152 | 56 | 960 | 6265 | 66 | 8673 | −89.4 | +.0758 |
| 1185 | 1184.999972 | 6173 | 56 | 960 | 6292 | 65 | 8577 | −27.3 | +.0231 |
| 1190 | 1190.000006 | 6195 | 56 | 960 | 6314 | 48 | 6348 | +6.0 | −.0050 |
| 1195 | 1194.999973 | 6219 | 56 | 960 | 6324 | 64 | 8502 | −26.9 | +.0225 |
| 1200 | 1199.999899 | 6239 | 56 | 960 | 6357 | 55 | 7329 | −100.6 | +.0838 |

What is claimed is:

1. A method of determining frequency division setting for frequency dividers of a frequency synthesizer for controlling resolution of the frequency synthesizer, the frequency synthesizer including a divide by R frequency divider providing a first input of a phase detector, and a divide by N frequency divider coupling an output of a voltage controlled oscillator (VCO) to a second input of the phase detector, wherein an output of the phase detector is coupled to a voltage control input of the VCO, the method comprising the steps of:

(a) selecting a target frequency;

(b) selecting a frequency division number R for the divide by R frequency divider;

(c) selecting a frequency division number N for the divide by N frequency divider;

(d) calculating a frequency for the output of the VCO with the selected frequency division number R and the selected frequency division number N, with a first reference signal frequency assumed to be provided to an input of the divide by R frequency divider;

(e) calculating a difference between the calculated frequency and the target frequency; and (f) reselecting the frequency division number R and the frequency division number N and proceeding to step (d) if the calculated difference is greater than a predetermined amount.

2. A method for determining frequency division settings for frequency dividers of a frequency synthesizer for controlling resolution of the frequency synthesizer, the frequency synthesizer including a divide by R1 frequency divider providing a first input of a first phase detector, the R1 frequency divider receiving a reference signal at its input, a divide by N1 frequency divider coupling an output of a first voltage controlled oscillator (VCO) to a second input of the first phase detector, wherein an output of the first phase detector is coupled to a voltage control input of the first VCO, a divide by R2 frequency divider having an input receiving the output of the first VCO and an output providing a first input of a second phase detector, a divide by N2 frequency divider coupling an output of a second VCO to a second input of the second phase detector, wherein an output of the second phase detector is coupled to a voltage control input of the second VCO, the method comprising the steps of:

(a) selecting a target frequency;
(b) selecting a first value for a frequency division number R1 for the R1 frequency divider, a frequency division number R2 for the R2 frequency divider, a frequency division number N1 for the N1 frequency divider, and a frequency division number N2 for the N2 frequency divider;
(c) calculating a frequency for the output of the second VCO with the selected first values;
(d) calculating a difference between the calculated frequency and the target frequency; and
(e) reselecting the first value for the frequency division numbers R1, R2, N1 and N2 and proceeding to step (c) if the calculated difference is greater than a predetermined amount.

3. The method of claim 2 further comprising the step of:
(f) changing a frequency of the reference signal to limit the difference between the calculated frequency and the target frequency.

4. A method of controlling the resolution of a frequency synthesizer, the frequency synthesizer including a divide by R1 frequency divider providing a first input of a first phase detector, a divide by N1 frequency divider coupling an output of a first voltage controlled oscillator (VCO) to a second input of the first phase detector, wherein an output of the first phase detector is coupled to a voltage control input of the first VCO, a divide by R2 frequency divider having an input receiving the output of the first VCO and an output providing a first input of a second phase detector, a divide by N2 frequency divider coupling an output of a second VCO to a second input of the second phase detector, wherein an output of the second phase detector is coupled to a voltage control input of the second VCO, the method comprising the steps of:
providing a reference signal to the input of the divide by R1 frequency divider;
mixing the output of the first VCO with the output of the second VCO to provide the input to the divide by N2 frequency divider; and
varying frequency of a signal at the output of the second VCO by:
changing a frequency division number R1 in the divide by R1 frequency divider;
changing a value for a frequency division number N1 in the divide by N1 frequency divider;
changing a value for a frequency division number R2 in the divide by R2 frequency divider; and
changing a value for a frequency division number N2 in the divide by N2 frequency divider.

5. A method of controlling the resolution of a frequency synthesizer, the frequency synthesizer including a divide by R1 frequency divider providing a first input of a first phase detector, a divide by N1 frequency divider coupling an output of a first voltage controlled oscillator (VCO) to a second input of the first phase detector, wherein an output of the first phase detector is coupled to a voltage control input of the first VCO, a divide by R2 frequency divider having an input receiving the output of the first VCO and an output providing a first input of a second phase detector, a divide by N2 frequency divider coupling an output of a second VCO to a second input of the second phase detector, wherein an output of the second phase detector is coupled to a voltage control input of the second VCO, wherein the frequency synthesizer further includes a divide by R3 frequency divider having an input receiving the output of the first VCO and an output providing a first input of a third phase detector, a divide by N3 frequency divider coupling an output of a third VCO to a second input of the third phase detector, wherein an output of the third phase detector is coupled to a voltage control input of the third VCO, the method comprising the steps of:
providing a reference signal to the input of the divide by R1 frequency divider; and
varying frequency of a signal at the output of the second VCO by:
changing a frequency division number R1 in the divide by R1 frequency divider;
changing a value for a frequency division number N1 in the divide by N1 frequency divider;
changing a value for a frequency division number R2 in the divide by R2 frequency divider; and
changing a value for a frequency division number N2 in the divide by N2 frequency divider
changing a value for a frequency division number R3 in the divide by R3 frequency divider; and
changing a value for a frequency division number N3 in the divide by N3 frequency divider.

6. A method of controlling the resolution of a frequency synthesizer, the frequency synthesizer including a divide by R1 frequency divider providing a first input of a first phase detector, a divide by N1 frequency divider coupling an output of a first voltage controlled oscillator (VCO) to a second input of the first phase detector, wherein an output of the first phase detector is coupled to a voltage control input of the first VCO, a divide by R2 frequency divider having an input receiving the output of the first VCO and an output providing a first input of a second phase detector, a divide by N2 frequency divider coupling an output of a second VCO to a second input of the second phase detector, wherein an output of the second phase detector is coupled to a voltage control input of the second VCO, a divide by R3 frequency divider having an input receiving the output of the first VCO and an output providing a first input of a third phase detector, a divide by N3 frequency divider coupling an output of a third VCO to a second input of the third phase detector, wherein an output of the third phase detector is coupled to a voltage control input of the third VCO, the method comprising the steps of:
providing a reference signal to the input of the divide by R1 frequency divider;
mixing a signal from an output VCO with the output of the first VCO to provide a first mixed output;
mixing the first mixed output with the output of the second VCO to provide a second mixed output;
providing the second mixed output and the output of the third VCO to inputs of an output phase detector, the output phase detector providing a voltage control input to the output VCO; and
varying frequency of a signal at the output of the second VCO by:
changing a frequency division number R1 in the divide by R1 frequency divider;
changing a value for a frequency division number N1 in the divide by N1 frequency divider;
changing a value for a frequency division number R2 in the divide by R2 frequency divider;
changing a value for a frequency division number N2 in the divide by N2 frequency divider;
changing a value for a frequency division number R3 in the divide by R3 frequency divider; and
changing a value for a frequency division number N3 in the divide by N3 frequency divider.

7. A method for determining frequency division settings for frequency dividers of a frequency synthesizer for controlling resolution of the frequency synthesizer, the frequency synthesizer including a divide by R1 frequency divider providing a first input of a first phase detector, the divide by R1 frequency divider having an input receiving a reference signal, a divide by N1 frequency divider coupling an output of a first voltage controlled oscillator (VCO) to a second input of the first phase detector, wherein an output of the first phase detector is coupled to a voltage control input of the first VCO, a divide by R2 frequency divider having an input receiving the output of the first VCO and an output providing a first input of a second phase detector, a divide by N2 frequency divider coupling an output of a second VCO to a second input of the second phase detector, wherein an output of the second phase detector is coupled to a voltage control input of the second VCO, a divide by R3 frequency divider having an input receiving the output of the first VCO and an output providing a first input of a third phase detector, a divide by N3 frequency divider coupling an output of a third VCO to a second input of the third phase detector, wherein an output of the third phase detector is coupled to a voltage control input of the third VCO, a first mixer having a first input coupled to an output VCO, a second input coupled to the output of the first VCO, and providing an output, a second mixer having a first input coupled to the output of the first mixer a second input coupled to the output of the second VCO and having an output, and an output phase detector having inputs coupled to the output of the second mixer and the third VCO and an output providing a voltage control input to the output VCO, wherein frequency at the output of the output VCO is varied by the following steps:

(a) selecting a target frequency;
(b) selecting a first value for the frequency division numbers R1, R2, R3, N1, N2 and N3;
(c) calculating a frequency for the output of the output VCO with the selected first values, with a reference signal frequency assumed to be provided to an input of the divide by R1 frequency divider;
(d) calculating a difference between the calculated frequency and the target frequency;
(e) reselecting the first value for the frequency division numbers R1, R2, R3, N1, N2 and N3 and proceeding to step (c) if the calculated difference is greater than a predetermined amount.

8. The method of claim 7 further comprising the step of:
changing a frequency of the reference signal to further limit the difference between the calculated frequency and the target frequency.

9. The frequency synthesizer comprising:
a reference signal oscillator;
a divide by R1 frequency divider having an input connected to the reference signal oscillator and an output;
a first phase detector having a first input connected to the output of the divide by R1 frequency divider, a second input and an output;
a first voltage controlled oscillator (VCO) having a voltage control input coupled to the output of the first phase detector and an output;
a divide by N1 frequency divider connecting the output of the first VCO to the second input of the phase detector;
a divide by R2 frequency divider having an input connected to the output of the first VCO and an output;
a second phase detector having a first input connected to the output of the divide by R2 frequency divider, a second input and an output;
a second VCO having a voltage control input coupled to the output of the second phase detector and an output providing an output for the frequency synthesizer;
a divide by N2 frequency divider having an input coupled to the output of the second VCO and an output connected to the second input of the second phase detector; and
a mixer having a first input connected to the output of the first VCO, a second input connected to the output of the second VCO and an output connected to the input of the divide by N2 frequency divider.

10. The frequency synthesizer comprising:
a reference signal oscillator;
a divide by R1 frequency divider having an input connected to the reference signal oscillator and an output;
a first phase detector having a first input connected to the output of the divide by R1 frequency divider, a second input and an output;
a first voltage controlled oscillator (VCO) having a voltage control input coupled to the output of the first phase detector and an output;
a divide by N1 frequency divider connecting the output of the first VCO to the second input of the phase detector;
a divide by R2 frequency divider having an input connected to the output of the first VCO and an output;
a second phase detector having a first input connected to the output of the divide by R2 frequency divider, a second input and an output;
a second VCO having a voltage control input coupled to the output of the second phase detector and an output;
a divide by N2 frequency divider having an input coupled to the output of the second VCO and an output connected to the second input of the second phase detector;
a divide by R3 frequency divider having an input connected to the output of the first VCO and an output;
a third phase detector having a first input connected to the output of the divide by R3 frequency divider, a second input and an output;
a third VCO having a voltage control input coupled to the output of the third phase detector and an output;
a divide by N3 frequency divider having an input coupled to the output of the third VCO and an output connected to the second input of the third phase detector;
an output VCO having a voltage control input and an output providing an output for the frequency synthesizer;
a first mixer having a first input connected to the output of the first VCO, a second input connected to the output of the output VCO, and having an output;
a second mixer having a first input connected to the output of the first mixer, a second input connected to the output of the second VCO, and having an output; and
an output phase detector having a first input connected to the output of the second mixer, a second input connected to the output of the third VCO and an output coupled to the voltage control input of the output VCO.

11. The frequency synthesizer of claim 10 further comprising:
a summer having a first input coupled to the output of the output phase detector, an output connected to the voltage control input of the output VCO, and having a second input;
a presteering D/A converter having an output connected to the second input of the summer.

* * * * *